United States Patent
Yamamoto

(10) Patent No.: US 7,795,982 B2
(45) Date of Patent: Sep. 14, 2010

(54) SURFACE-MOUNT TYPE CRYSTAL OSCILLATOR

(75) Inventor: Ken Yamamoto, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 91 days.

(21) Appl. No.: 12/336,926

(22) Filed: Dec. 17, 2008

(65) Prior Publication Data

US 2009/0160563 A1    Jun. 25, 2009

(30) Foreign Application Priority Data

Dec. 19, 2007    (JP) ............................. 2007-326813

(51) Int. Cl.
*H01L 21/60* (2006.01)
*H01L 41/053* (2006.01)
*H01L 41/107* (2006.01)
*H03B 1/00* (2006.01)
*H03B 5/36* (2006.01)

(52) U.S. Cl. ..................... 331/68; 331/108 D; 331/158; 310/318

(58) Field of Classification Search ................. 331/68, 331/69, 116 R, 116 FE, 108 D, 158, 159; 310/311, 314, 318

See application file for complete search history.

(56) References Cited

U.S. PATENT DOCUMENTS

2003/0227339 A1* 12/2003 Makuta ..................... 331/158

FOREIGN PATENT DOCUMENTS

| JP | 2001-244744 A | 9/2001 |
| JP | 2005-236892 A | 9/2005 |
| JP | 2005-244939 A | 9/2005 |

OTHER PUBLICATIONS

Office Action issued by Japanese Patent Office on Apr. 20, 2010 for Japanese counterpart Patent Application No. 2007-326813 with brief English translation.

* cited by examiner

*Primary Examiner*—David Mis
(74) *Attorney, Agent, or Firm*—Knobbe Martens Olson & Bear LLP

(57) ABSTRACT

A surface-mount type crystal oscillator includes a container body with a recess, a first holding terminal and a second holding terminal provided in the recess, a crystal blank secured to the first and second holding terminals, and an IC chip including a first terminal and a second terminal on respective opposite sides of one end of the IC chip, the first and second terminals being used to electrically connect the amplification element within the IC chip to the crystal blank. In the recess, the first connection terminal is connected, by wire bonding, to one of a first circuit terminal connected to the first holding terminal and a second circuit terminal connected to the second holding terminal. The second connection terminal is connected, by wire bonding, to one of a third circuit terminal connected to the first holding terminal and a fourth circuit terminal connected to the second holding terminal.

6 Claims, 4 Drawing Sheets

SURFACE-MOUNT TYPE CRYSTAL OSCILLATOR

BACKGROUND OF THE INVENTION

1. Field of the Invention

The present invention relates to a surface-mount type quartz crystal oscillator, and in particular, to a surface-mount type crystal oscillator that allows an oscillation frequency to be adjusted during manufacture by irradiating a quartz crystal blank with ion beams.

2. Description of the Related Arts

A surface-mount type quartz crystal oscillator includes a quartz crystal blank and an IC (Integrated Circuit) chip including an oscillation circuit using the crystal blank, and the crystal blank and IC chip are accommodated in a container. Owing to the small size and light weight thereof, the surface-mount type crystal oscillator is incorporated specifically into portable electronic equipment as a reference source for frequency and time. To be set to a desired value for the crystal oscillator, the oscillation frequency can desirably be adjusted during manufacture. Thus, in some crystal oscillators, the crystal blank is irradiated with ion beams during manufacture to vary a resonance frequency of the crystal blank so as to allow the oscillation frequency to be adjusted.

FIG. 1A is a sectional view of a conventional surface-mount type crystal oscillator, and FIG. 1B is a plan view of the crystal oscillator with a cover removed therefrom.

The surface-mount type crystal oscillator uses container body 3 with a recess in which IC chip 1 and crystal blank 2 are accommodated. Metal cover 4 is placed over container body 3 to close the recess to hermetically encapsulate IC chip 1 and crystal blank 2 in container body 3. IC chip 1 has integrated electronic circuits making up an oscillation circuit using crystal blank 2. IC chip 1 includes at least an amplification element for oscillation. A configuration of the oscillation circuit will be described below. It is assumed that a Colpitts oscillation circuit is constructed here.

In IC chip 1, the electronic circuits are formed on one principal surface of a semiconductor substrate by a normal semiconductor device fabrication process. Thus, the one of the principal surfaces of the semiconductor substrate on which the electronic circuits are formed is hereinafter referred to as a "circuit formation surface" of the IC chip. A plurality of IC terminals 6 are also formed on the circuit formation surface to connect IC chip 1 to an external circuit. IC terminals 6 are arranged in two rows on the generally rectangular circuit formation surface along paired long sides thereof. IC terminals 6 include pairs of connection terminals 6x, 6y for use in electric connection to crystal blank 2. IC terminals 6 further include a power supply terminal, an output terminal, a ground terminal, and a standby terminal. Connection terminals 6x, 6y are provided on opposite sides of one end of the circuit formation surface of IC chip 1 in a longitudinal direction thereof.

As shown in FIG. 2, crystal blank 2 is a generally rectangular, AT-cut quartz crystal blank including excitation electrodes 7x, 7y on opposite principal surfaces thereof. Lead-out electrodes 8x, 8y extend from paired excitation electrodes 7x, 7y, respectively, toward an outer peripheral portion of crystal blank 2. Here, lead-out electrodes 8x, 8y extend toward opposite sides of one end of crystal blank 2, that is, opposite ends of one short side. Each of lead-out electrodes 8x, 8y is formed to be folded back between the principal surfaces of crystal blank 2 at the position of the end of crystal blank 2.

In illustrated crystal blank 2, when lead-out electrodes 8x, 8y extend downward in the figures from excitation electrodes 7x, 7y on the respective principal surfaces, lead-out electrode 8x connected to excitation electrode 7x on the illustrated front-side principal surface extends to a right end of a lower side of crystal blank 2. In crystal blank 2, the excitation electrodes and the lead-out electrodes are formed to be rotationally symmetric about a longitudinal central line of crystal blank 2. Thus, even if crystal blank 2 is turned upside down, the lead-out electrode still extends to the right end of the lower side. As described below, lead-out electrodes 8x, 8y are electrically connected to paired connection terminals 6x, 6y on IC chip 1.

FIG. 3 is a circuit diagram showing a circuit configuration of this crystal oscillator. In this figure, crystal blank 2 is depicted by a circuit symbol of a crystal element. IC chip 1 includes an inverter element as amplification element 5 for oscillation made up of, for example, a C-MOS (complementary MOS (metal-oxide-semiconductor)) element. Moreover, resistor R and split capacitors Ca, Cb are formed on IC chip 1. Resistor R is provided between an input end and an output end of amplification element 5 as feedback resistance. Crystal blank 2 is also connected between the input end and out end of amplification element 5. Here, excitation electrode 7x and lead-out electrode 8x are connected to the output end of amplification element 5. Excitation electrode 7y and the lead-out electrode 8y are connected to the input end of amplification element 5. Capacitor Ca is provided between the output end of amplification element 5 and a ground point. Capacitor Cb is provided between the input end of amplification element 5 and the ground point. Oscillation output Vout is obtained from the output end of amplification element 5. In FIG. 3, the elements located outside a dotted frame are provided inside IC chip 1.

Container body 3 is a flat, generally rectangular parallelepiped and is made up of laminated ceramic. A generally rectangular recess is formed in one principal surface of container body 3 to accommodate IC chip 1 and crystal blank 2. Two step portions 9a, 9b are formed on an inner wall of the recess. The height of the recess from an inner bottom surface thereof is such that first step portions 9a are lower than second step portions 9b. First step portions 9a are formed along opposite long sides of the recess. Second step portions 9b are formed along opposite short sides of the recess. A plurality of circuit terminals 10 for connection to IC terminals 6 of IC chip 1 are provided on a top surface of each of first step portions 9a. Paired holding terminals 11x, 11y for electric connection to crystal blank 2 are provided on a top surface of second step portion 9b provided at one end of the recess. Here, second step portion 9b provided at the one end of the recess may be divided into two pieces so that holding terminals 11x, 11y are independent of each other.

IC chip 1 is secured to the inner bottom surface of container body 3 so that the circuit formation surface faces upward. Each of IC terminals 6 on the circuit formation surface is electrically connected, by wire bonding using lead wire 12 such as a gold (Au) wire, to a corresponding one of circuit terminals 10, provided on first step portions 9a. In this case, IC chip 1 is located on the inner bottom surface of the recess so that the end thereof with connection terminals 6x, 6y formed thereat is located closer to the step portion with holding terminals 11x, 11y formed thereon. Those of the circuit terminals provided on both first step portions 9a which are closest to holding terminals 11x, 11y, that is, circuit terminals 10x, 10y, are connected to connection terminals 6x, 6y, respectively, of IC chip 1 by wire bonding. Holding terminals 11x, 11y, provided on second step portion 9b, are electrically connected to circuit terminals 10x, 10y via through-holes 15 or the like.

Mounting terminals 14 for use for surface-mounting the crystal oscillator on a wiring board are provided in four corners of an outer bottom surface of the container body. Circuit terminals 10 connected to the power supply, output, ground, and standby terminals, included in IC terminals 6, are electrically connected to mounting terminals 14 via through-holes and conductive paths formed through lamination plane between ceramic layers in container body 3.

Crystal blank 2 is held in the recess of container body 3 and electrically connected to IC chip 1, by securing paired lead-out electrodes 8x and 8y to holding terminals 10x, 10y, respectively, with conductive adhesive 13 at positions where paired lead-out electrodes 8x, 8y are led out. In this case, in the recess, crystal blank 2 is positioned above IC chip 1 so as to cover IC chip 1.

Such a crystal oscillator is completed by securing IC chip 1 to the inner bottom surface of the recess, carrying out the wire bonding, then securing crystal blank 2 to holding terminals 10x, 10y, and thereafter joining metal cover 4 to the top surface of container body 3 at a position where metal cover 4 surrounds the opening of the recess, to close the recess so that IC chip 1 and crystal blank 2 are hermetically encapsulated in container body 3. In the crystal oscillator, one of the excitation electrodes of crystal blank 2, that is, excitation electrode 7x, located opposite metal cover 4, is electrically connected to the output end of amplification element 5 in IC chip 1.

For the above-described crystal oscillator, the oscillation frequency is adjusted as follows. Crystal blank 2 is secured to holding terminals 10x, 10y. Then, power is actually supplied to the crystal oscillator to perform an oscillation operation. Excitation electrode 7x is irradiated with ion beams from an ion gun (not shown) with the oscillation frequency monitored. A sputtering effect of the ion beams reduces the mass of excitation electrode 7x to increase the oscillation frequency. Thus, excitation electrode 7x is irradiated with the ion beams until the oscillation frequency reaches a predetermined value, to adjust the oscillation frequency. Once the adjustment of the oscillation frequency is completed, metal cover 4 may be joined to container body 3 to complete the crystal oscillator. The principal surface of crystal blank 2 which is irradiated with the ion beams is not located opposite IC chip 1, that is, is located opposite metal cover 4 when the recess is closed by metal cover 4.

In the above-described example, excitation electrode 7x, irradiated with the ion beams, is connected to the output end of amplification element 5. Thus, charges generated by the irradiation with the ion beams flow into the ground point via amplification element 5 to avoid affecting the oscillation operation. Here, as described in Japanese Patent Laid-Open No. 2001-244744 (JP-2001-244744A), when the excitation electrode irradiated with the ion beams is connected to the input end of amplification element 5, charges generated by the ion beam irradiation are accumulated at the input end to change an operating point of amplification element 5. As a result, a phenomenon such as stoppage of the oscillation may occur. When the oscillation is thus stopped, the adjustment of the oscillation frequency cannot be continued.

The arrangement of the IC terminals on IC chip 1 may vary with the type of the IC chip based on a design of the IC chip vendor. Even when the condition that the paired connection terminals for connection to the crystal blank are provided at the end of IC chip 1 is met, which of the output and input ends of the amplification element connects to each of the two connection terminals may vary depending on the vendor's design. For example, in the above description, connection terminal 6x located in a lower left corner of the configuration shown in FIG. 1B is connected to the output end of the amplification element. However, connection terminal 6x may be connected to the input end depending on the design of the IC chip.

Now, in the configuration shown in FIG. 1B, it is assumed that connection terminal 6x located in the lower left corner of IC chip 1 in the figure is connected to the output end of amplification element 5. Then, if the crystal blank shown in FIG. 2 is used, then during frequency adjustment, excitation electrode 7x, electrically connected to the output end of amplification element 5, is irradiated with ion beams. This avoids affecting the oscillation operation. However, if connection terminal 6x located in the lower left corner of IC chip 1 is connected to the input end of amplification element 5, the excitation electrode electrically connected to the input end of amplification element 5 is irradiated with ion beams. Thus, the oscillation operation is affected.

To deal with the fact that the paired connection terminals on the IC chip may be connected to the amplification element for oscillation in two manners, that is, the connection terminal may be connected to either the input side or output side of the amplification element, two crystal blanks 2 shown in FIGS. 4A and 4B in which the lead-out electrodes extend from the excitation electrodes in different directions to each other crystal blank may be provided so that one of crystal blanks 2 can be used depending on the type of IC chip 1. Here, the crystal blank shown in FIG. 4A is identical to the one shown in FIG. 2. The crystal blank shown in FIG. 4B is a symmetrical mirror image of the one shown in FIG. 4A. That is, in FIG. 4B, lead-out electrode 8x extends downward from excitation electrode 7x in the figure and thus extends toward the left end of the lower side of crystal blank 2.

In the configuration shown in FIG. 1, if an IC chip is used in which connection terminal 6x located in the lower left corner of the IC chip in the figure is connected to the input end of the amplification element, the crystal blank shown in FIG. 4B is used and not the one shown in FIG. 4A. Then, the excitation electrode irradiated with ion beams is electrically connected to another connection terminal 6y, which is connected to the output end of the amplification element. Thus, the oscillation operation can be prevented from being affected.

As described above, the oscillation frequency can be adjusted regardless of whatever IC chip is used, by using one of the two types of crystal blanks depending on the arrangement of the paired connection terminals on the IC chip. However, in this case, two types of crystal blanks in a mirror image relationship need to be in stock. Furthermore, which of the crystal blanks is to be used needs to be selected during manufacture. This may deteriorate productivity.

SUMMARY OF THE INVENTION

Thus, an object of the present invention is to provide a surface-mount type crystal oscillator which enables the oscillation frequency to be adjusted and which allows the use of a single type of crystal blank regardless of the arrangement of the paired connection terminals on the IC chip.

The object of the present invention is accomplished by a surface-mount type crystal oscillator including: a container body with a recess; a first holding terminal and a second holding terminal provided in the recess; a crystal blank accommodated in the recess and including an excitation electrode on each principal surface of the crystal blank, the crystal blank being secured to the first and second holding terminals so that the paired excitation electrodes are electrically connected to the first and second holding terminals, respectively; and an IC chip accommodated in the recess and on which an oscillating amplification element for an oscillation circuit using the crystal blank is at least integrated, the IC chip including a first terminal and a second terminal on respective opposite sides of one end of the IC chip, the first and second terminals being used to electrically connect the amplification element to the crystal blank, wherein a first circuit terminal and a second circuit terminal are provided in the recess in proximity to the first connection terminal, the first circuit terminal being electrically connected to the first holding terminal, the second circuit terminal being electrically connected to the second holding terminal, wherein a third circuit terminal and a fourth circuit terminal are provided in the recess in proximity to the second connection terminal, the third circuit terminal being electrically connected to the first holding terminal, the fourth circuit terminal being electrically connected to the second holding terminal, wherein the first connection terminal is connected to one of the first and second circuit terminals by wire bonding, and wherein the second connection terminal is connected to one of the third and fourth circuit terminals by wire bonding.

This configuration allows a connection relationship between both the first and second holding terminals and both the first and second connection terminals to be optionally set by selecting which of the first and second circuit terminals is connected to the first connection terminal and which of the third and fourth circuit terminals is connected to the second connection terminal. Thus, regardless of however the paired connection terminals are arranged on the IC chip, a desired one of the first and second holding terminals can be electrically connected to one of the paired connection terminals which is connected to an output end of the amplification element. Regardless of the arrangement of the connection terminals on the IC chip, the single type of crystal blank can be used to electrically connect the excitation electrode which is to be irradiated with ion beams to the output end of the amplification element. This eliminates the need to prepare two types of crystal blanks which are in a mirror image relationship in terms of the arrangement of the excitation electrodes and lead-out electrodes. Steps of manufacturing the crystal oscillator are thus simplified to improve productivity.

DETAILED DESCRIPTION OF THE PREFERRED EMBODIMENTS

Figure 1A:
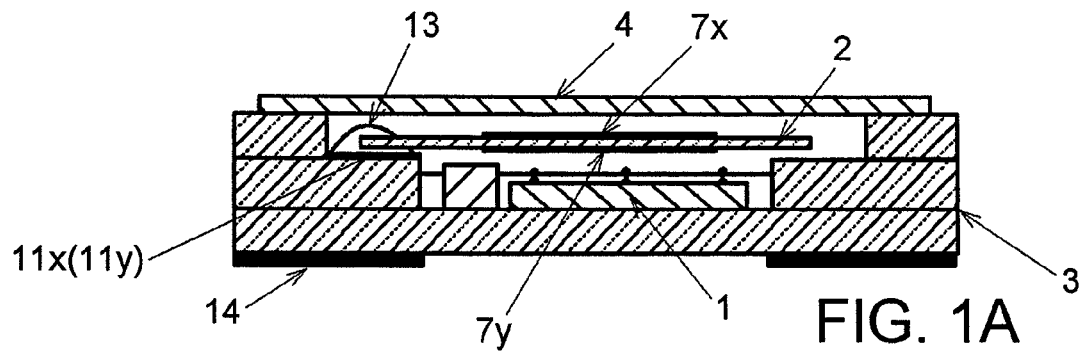
FIG. 1A is a sectional view illustrating an example of a configuration of a conventional surface-mount type crystal oscillator.
Figure 1B:
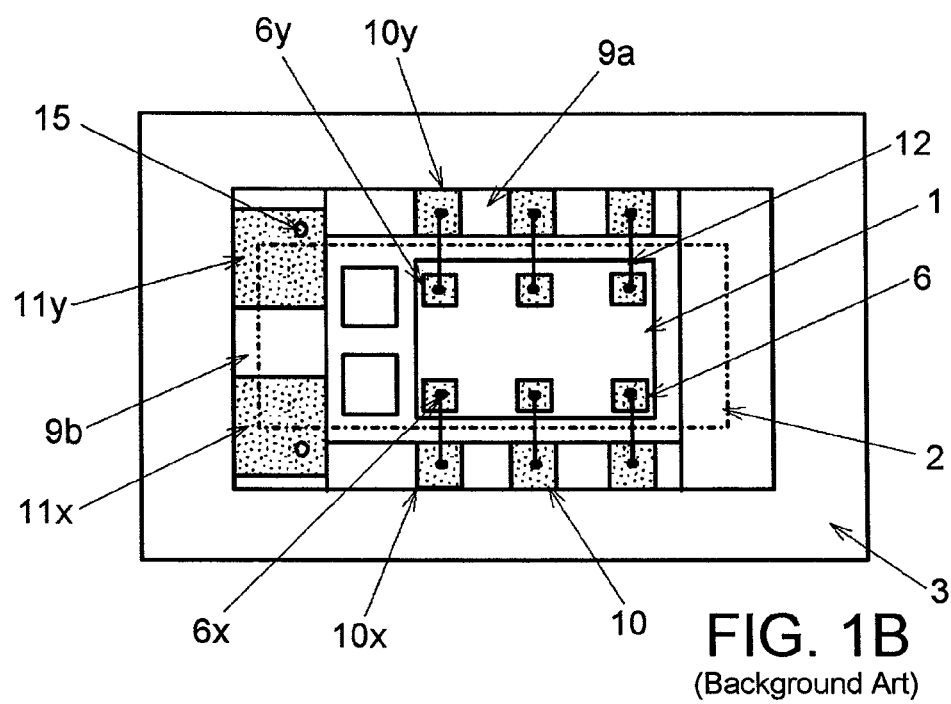
FIG. 1B is a plan view of the crystal oscillator shown in FIG. 1A, with a cover removed therefrom.
Figure 5A:
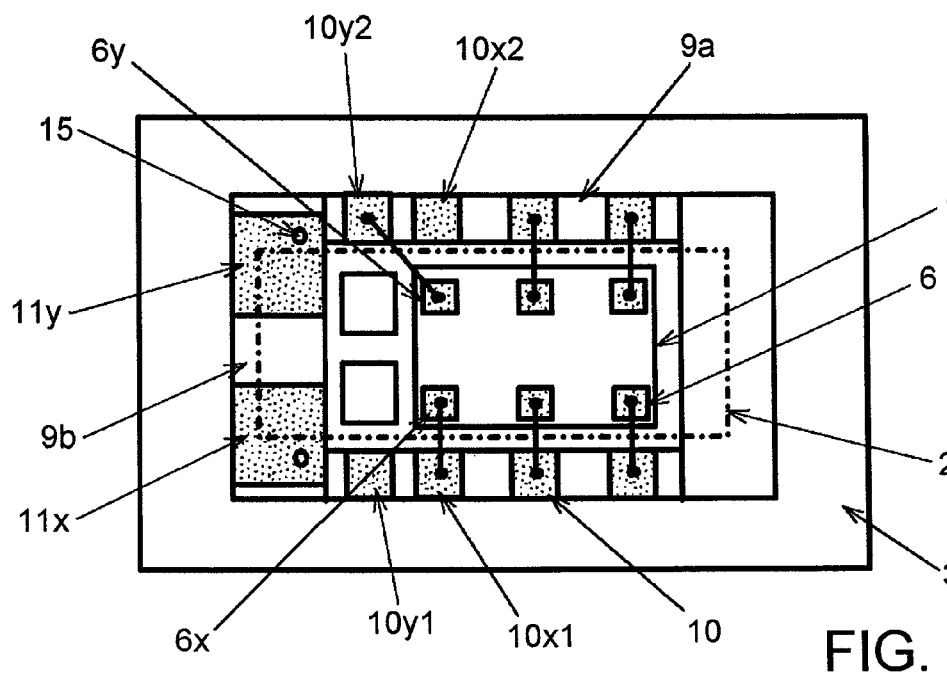
FIGS. 5A and 5B are plan views each showing a surface-mount type crystal oscillator according to an embodiment of the present invention with a cover removed therefrom.
Figure 5B:
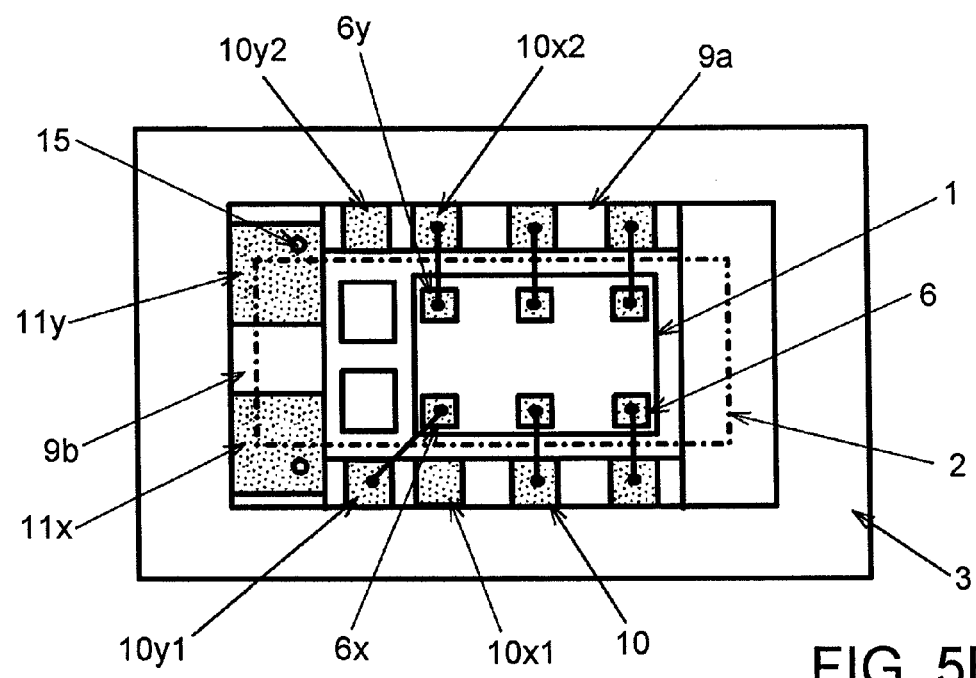

In FIGS. 5A and 5B each showing a surface-mount type crystal oscillator according to an embodiment of the present invention, the same components as those in FIGS. 1A and 1B are denoted by the same reference numerals, and description thereof is simplified or omitted.

The illustrated crystal oscillators are similar to the one shown in FIGS. 1A and 1B except that different types of IC chips can be dealt with using the same type of crystal blank. The configuration of container body 3 is the same for the crystal oscillators shown in FIGS. 5A and 5B. However, the crystal oscillators shown in FIGS. 5A and 5B differ from each other in which of paired connection terminals 6x, 6y of IC chip 1 is connected an output end of amplification element 5 and which of paired connection terminals 6x, 6y is connected an input end of amplification element 5.

As described above, the crystal oscillators according to the present embodiment use container body 3 including a recess with IC chip 1 secured to an inner bottom surface thereof. As described above, first step portion 9a and second step portion 9b are formed on an inner wall of the recess. Each IC terminal 6 of IC chip 1 is electrically connected to a corresponding one of circuit terminals 10 formed on a top surface of first step portion 9a by lead wire 12 for wire bonding. Paired ones of IC terminals 6 which are arranged in a vertical direction at a left end of IC chip 1 in the figure are connection terminals 6x, 6y. Paired holding terminals 11x, 11y are provided on a top surface of second step portion 9b at one end of the recess.

Figure 2:
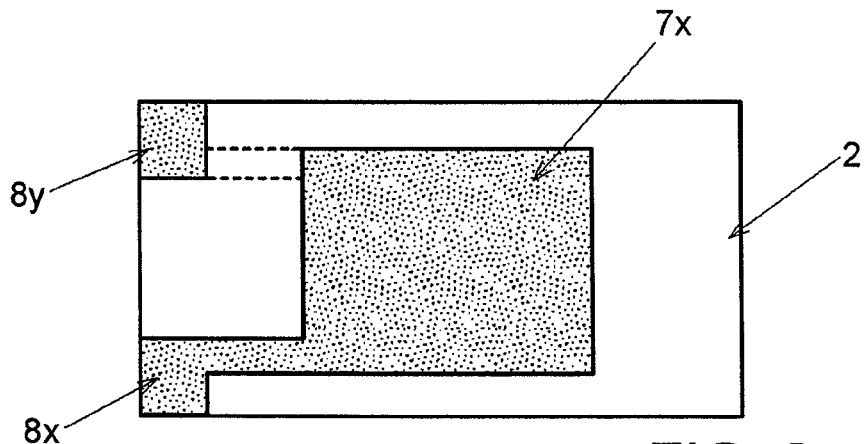
FIG. 2 is a plan view illustrating a crystal blank used in the crystal oscillator shown in FIGS. 1A and 1B.
Figure 3:
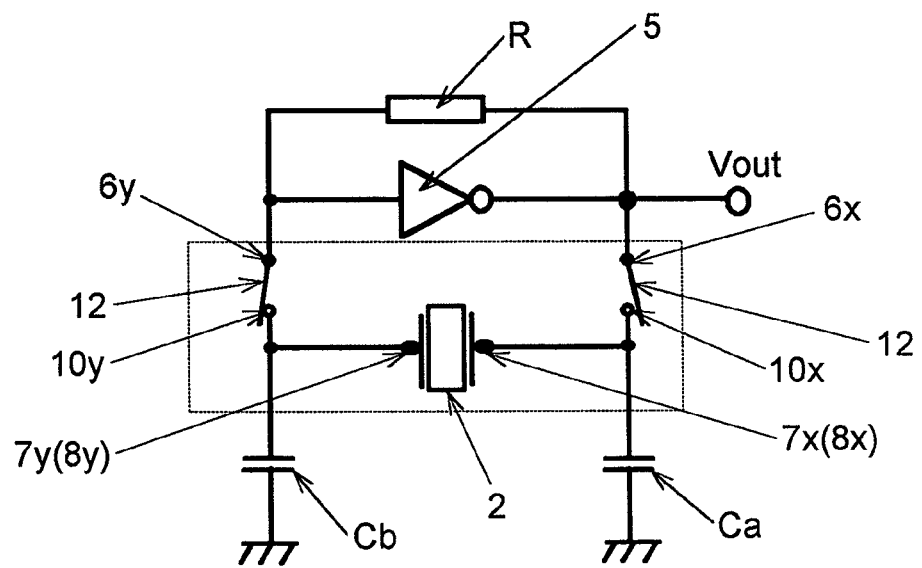
FIG. 3 is a circuit diagram of the crystal oscillator shown in FIGS. 1A and 1B.

Crystal blank 2 shown in FIG. 2 is used in the crystal oscillators according to the present embodiment. Opposite sides of one end of crystal blank 2 where lead-out electrodes 8x, 8y extend from excitation electrodes 7x, 7y are secured to holding terminals 11x, 11y, respectively, with conductive adhesive 13. Crystal blank 2 is thus held above IC chip 1 in the recess.

In the present embodiment, circuit terminals 10x1, 10y1 are arranged on an end of a top surface of a lower one of paired first step portions 9a in the figure which end is closer to holding terminal 11x. One of the circuit terminals, that is, circuit terminal 10x1, is electrically connected to holding terminal 11x via through-hole 15 or the like formed in container body 3. Circuit terminal 10y1 is similarly electrically connected to holding terminal 11y via through-hole 15 or the like. Furthermore, circuit terminals 10x2, 10y2 are arranged on an end of a top surface of an upper one of paired first step portions in the figure which end is closer to holding terminal 11y. Circuit terminal 10x2 is electrically connected to holding terminal 11x via through-hole 15 or the like. Circuit terminal 10y2 is electrically connected to holding terminal 11y via through-hole 15 or the like.

When lead-out electrode 8x is assumed to extend downward from excitation electrode 7x toward a lower side of crystal blank 2, lead-out electrode 8x extends to a right end of the lower side. Here, in FIGS. 5A and 5B, if connection terminal 6x in the lower left corner of IC chip 1 in the figure is connected to the output end of amplification element 5, connection terminal 6x and circuit terminal 10x1 are connected together by lead wire 12 by wire bonding. Remaining connection terminal 6y and circuit terminal 10y2 are connected together by lead wire 12. This connection state is shown in FIG. 5A. In this case, when crystal blank 2 is assumed to be secured to holding terminals 11x, 11y as described above, excitation electrode 7x provided on a principal surface of crystal blank 2 which is not located opposite IC chip 1, that is, the principal surface of crystal blank 2 which faces the opening of the recess, is electrically connected to the output end of amplification element 5 via connection terminal 6x.

In contrast, if connection terminal 6x in the lower left corner of IC chip 1 in the figure is connected to the input end of amplification element 5 and another connection terminal 6y is connected to the output end of amplification element 5, connection terminal 6x and circuit terminal 10y1 are connected together by lead wire 12 by wire bonding, and connection terminal 6y and circuit terminal 10x2 are connected together by lead wire 12. This connection state is shown in FIG. 5B. Also in this case, if crystal blank 2 is secured to holding terminals 11x, 11y, excitation electrode 7x provided on the principal surface of crystal blank 2 which is not located opposite IC chip 1, that is, the principal surface of crystal blank 2 which faces the opening of the recess, is electrically connected to the output end of amplification element 5 via connection terminal 6y.

Figure 6:
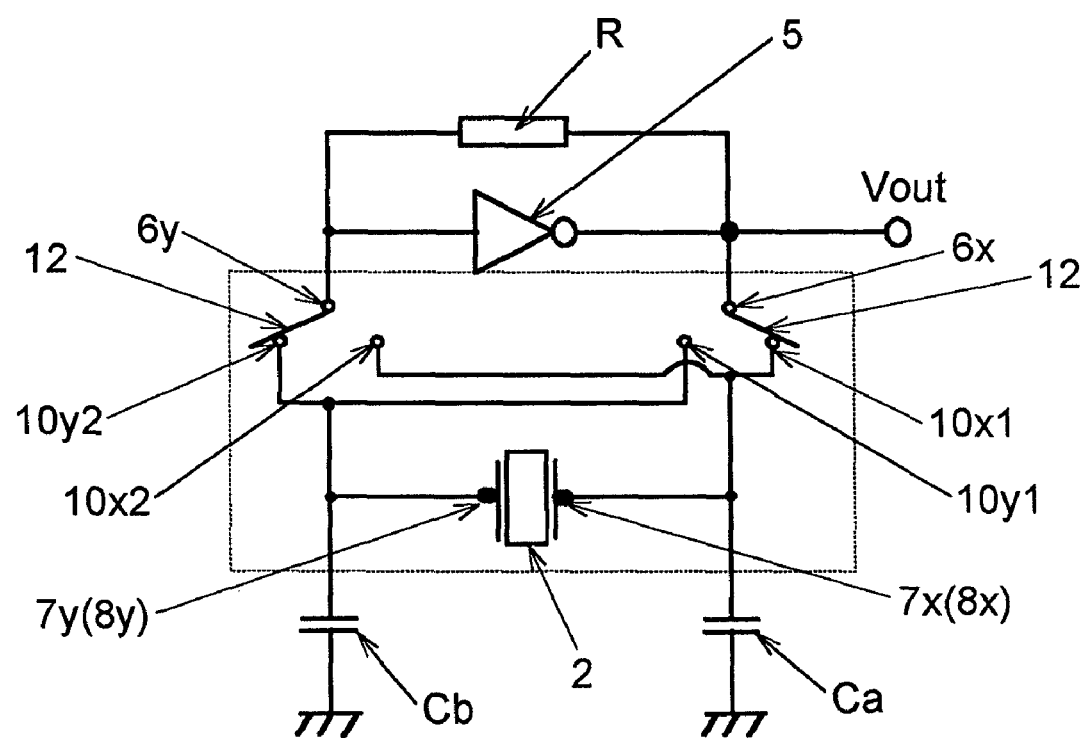
FIG. 6 is a circuit diagram of the crystal oscillator shown in each of FIGS. 5A and 5B.

FIG. 6 shows the circuit configuration of the oscillation circuit according to the present embodiment. In the present embodiment, by switching the circuit terminals connected to connection terminals 6x, 6y by wire bonding, the excitation electrode to be irradiated with ion beams can be connected to the output end of amplification element 5 regardless of which of paired connection terminals 6x, 6y connects to the output end of amplification element 5. This eliminates the need to prepare two types of crystal blanks which are in a mirror image relationship in terms of the arrangement of the excitation electrodes and lead-out electrodes. Thus, a single type of crystal blank can be used to allow the utilization of a plurality of types of IC chips with the connection terminals differently arranged. This improves productivity.

Figure 4A:
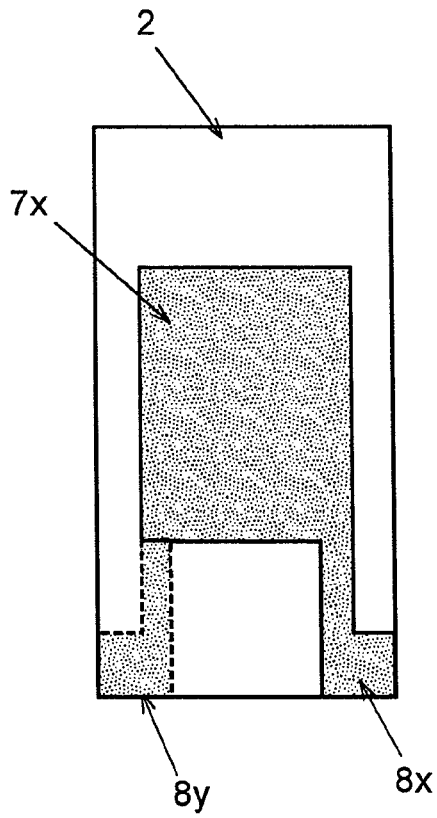
FIGS. 4A and 4B are plan views showing examples of crystal blanks.
Figure 4B:
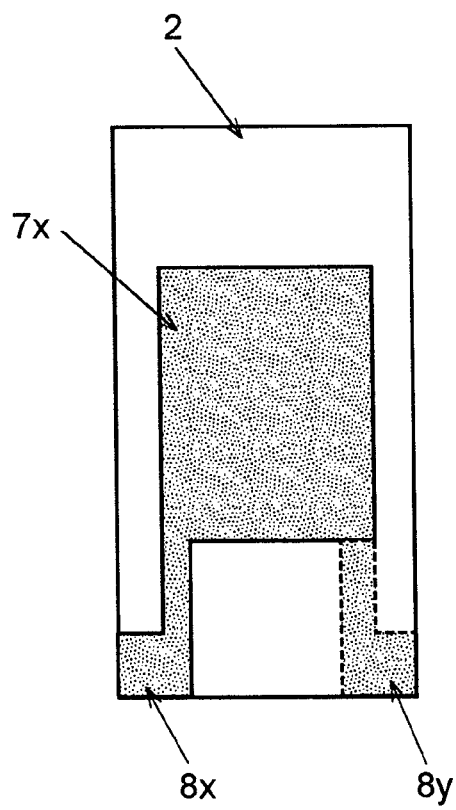

The above-described embodiment uses the crystal blank shown in FIG. 2. However, the present embodiment can similarly use the crystal blank shown in FIG. 4B, which is in a mirror image relationship with the crystal blank shown in FIG. 2.

What is claimed is:

1. A surface-mount type crystal oscillator comprising:
   a container body with a recess;
   a first holding terminal and a second holding terminal provided in the recess;
   a crystal blank accommodated in the recess and including an excitation electrode on each principal surface of the crystal blank, the crystal blank being secured to the first and second holding terminals so that the paired excitation electrodes are electrically connected to the first and second holding terminals, respectively; and
   an IC chip accommodated in the recess and on which an oscillating amplification element for an oscillation circuit using the crystal blank is at least integrated, the IC chip including a first terminal and a second terminal on respective opposite sides of one end of the IC chip, the first and second terminals being used to electrically connect the amplification element to the crystal blank,
   wherein a first circuit terminal and a second circuit terminal are provided in the recess in proximity to the first connection terminal, the first circuit terminal being electrically connected to the first holding terminal, the second circuit terminal being electrically connected to the second holding terminal,
   wherein a third circuit terminal and a fourth circuit terminal are provided in the recess in proximity to the second connection terminal, the third circuit terminal being electrically connected to the first holding terminal, the fourth circuit terminal being electrically connected to the second holding terminal,
   wherein the first connection terminal is connected to one of the first and second circuit terminals by wire bonding, and
   wherein the second connection terminal is connected to one of the third and fourth circuit terminals by wire bonding.

2. The crystal oscillator according to claim 1, wherein the crystal blank is held above the IC chip in the recess, and
   the wire bonding is configured such that one excitation electrode is electrically connected to one of the first and second connection terminals corresponding to an output end of the amplification element, the one excitation electrode being one of the paired excitation electrodes which is provided on a principal surface of the crystal blank which is not located opposite the IC chip.

3. The crystal oscillator according to claim 2, wherein an oscillation frequency is adjusted by irradiating the one excitation electrode with ion beams.

4. The crystal oscillator according to claim 2, wherein one of the first and second connection terminals on the IC chip is connected to the output end of the amplification element, and the other of the first and second connection terminals is connected to an input end of the amplification element.

5. The crystal oscillator according to claim 1, wherein a step portion is formed on an inner wall of the recess, the first and second terminals are provided on a top surface of the step portion, and the IC chip is secured to an inner bottom surface of the recess.

6. The crystal oscillator according to claim 1, wherein the crystal blank is a generally rectangular AT-cut crystal blank.

* * * * *